United States Patent
Kamiya et al.

(10) Patent No.: US 6,943,074 B2
(45) Date of Patent: Sep. 13, 2005

(54) NONVOLATILE SEMICONDUCTOR MEMORY DEVICE HAVING A TWO-LAYER GATE STRUCTURE AND METHOD FOR MANUFACTURING THE SAME

(75) Inventors: Eiji Kamiya, Kamakura (JP); Kazuhiro Shimizu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/412,365

(22) Filed: Apr. 14, 2003

(65) Prior Publication Data

US 2003/0209753 A1 Nov. 13, 2003

Related U.S. Application Data

(62) Division of application No. 09/558,585, filed on Apr. 26, 2000, now abandoned.

(30) Foreign Application Priority Data

Apr. 27, 1999 (JP) .......................................... 11-119848

(51) Int. Cl.⁷ .................. H01L 21/8238; H01L 21/336
(52) U.S. Cl. ........................ 438/211; 438/257; 438/261
(58) Field of Search ................................ 438/257, 266, 438/591, 593, 201, 211, 261, 262; 257/314–322

(56) References Cited

U.S. PATENT DOCUMENTS

| 5,284,786 | A | 2/1994 | Sethi ......................... 257/321 |
| 5,451,803 | A | 9/1995 | Oji et al. ..................... 257/316 |
| 5,559,048 | A | 9/1996 | Inoue .......................... 257/316 |
| 5,708,285 | A | 1/1998 | Otani et al. .................. 257/315 |
| 5,872,035 | A | 2/1999 | Kim et al. .................... 438/261 |
| 6,486,030 | B2 * | 11/2002 | Gonzalez et al. ........... 438/261 |

FOREIGN PATENT DOCUMENTS

| CN | 1170959 | 1/1998 |
| JP | 6-350097 | 12/1994 |
| JP | 7-115144 | 5/1995 |
| JP | 8-17948 | 1/1996 |
| JP | 8-46066 | 2/1996 |
| JP | 9-36263 | 2/1997 |
| JP | 10-41413 | 2/1998 |
| JP | 10-261725 | 9/1998 |

* cited by examiner

*Primary Examiner*—Hung Vu
(74) *Attorney, Agent, or Firm*—Oblon, Spivak, McClelland, Maier & Neustadt, P.C.

(57) ABSTRACT

In a memory cell, a gate oxide film is formed on a surface of semiconductor substrate and a first floating gate is formed on the gate oxide film. An insulating film is formed on a first floating gate and a second floating gate is formed on the insulating film. The first and second floating gates constitute a floating gate in the memory cell. An insulating film between the first floating gate and the second floating gate acts as an etching stopper when a polysilicon constituting the second floating gate is etched.

9 Claims, 5 Drawing Sheets

NONVOLATILE SEMICONDUCTOR MEMORY DEVICE HAVING A TWO-LAYER GATE STRUCTURE AND METHOD FOR MANUFACTURING THE SAME This is a Divisional Application of application Ser. No. 09/558,585, filed on Apr. 26, 2000 now abandoned. This application is based upon and claims the benefit of priority from the prior Japanese Patent Application No. 11-119848, filed on Apr. 27, 1999, the entire contents of which are incorporated herein by reference.

CROSS-REFERENCE TO RELATED APPLICATIONS

This application is based upon and claims the benefit of priority from the prior Japanese Patent Application No. 11-119848, filed Apr. 27, 1999, the entire contents of which are incorporated herein by reference.

BACKGROUND OF THE INVENTION

The present invention relates to a nonvolatile semiconductor memory device of a two-layered gate structure, such as a flash EEPROM and a method for manufacturing the same.

In recent years, a NAND cell type EEPROM has been proposed as one of electrically erasable semiconductor memory devices. This NAND cell type EEPROM is of such a type that a plurality of memory cells are provided with their source and drain shared by adjacent ones in a series-connected manner and each cell connected as one unit to a corresponding bit line. The respective memory cell constitutes a two-layered gate structure with a floating gate (charge storage layer) and control gate stacked with an insulating film therebetween.

In this type of nonvolatile semiconductor memory device, a shallow trench isolation (STI) is adopted, as an element isolation area, in place of a LOCOS (Local oxidation of silicon). In the case where a nonvolatile semiconductor memory device using such an STI is manufactured, a process for forming a floating gate is used before forming a trench.

FIGS. 7 and 8 show a conventional nonvolatile semiconductor memory device using a process for forming a floating gate in advance.

In FIGS. 7 and 8, a gate oxide film 102 and plurality of floating gates 103 of, for example, polysilicon are formed over a surface of a semiconductor substrate 101. A buried insulating film 104 of, for example, a silicon oxide film constituting an STI area is formed in a semiconductor substrate 101 at an area situated between those floating gates 103. For example, an ONO film 105 is formed as a composite insulating film on the respective floating gate 103. A control gate 106 of, for example, polysilicon is formed on the ONO film 105. A mask material 107 of, for example, silicon nitride film is formed on the control gate 106. The mask material 107 is used as a mask when the control gate 106 and floating gate 103 are etched.

As shown in FIG. 7, the floating gate 103 is comprised of a first floating gate 103a and second floating gate 103b formed on the first floating gate 103a. The buried insulating film 104 is formed after the formation of the first floating gate 103a but before the formation of the second floating gate 103b.

That is, the gate oxide film 102, first floating gate 103a of, for example, polysilicon and mask material (not shown) of, for example, a silicon nitride film are sequentially formed over the surface of a semiconductor substrate 101. The mask material is subjected to a patterning process. With the patterned mask material used as a mask, the first floating gate 103a, gate oxide film 102 and semiconductor substrate 101 are dry etched, for example, are reactive ion etched (RIE) to provide a plurality of trenches 108.

Then, a silicon oxide film is deposited, by a chemical vapor deposition (CVD) method, on a whole surface and, by doing so, the trench is buried with the silicon oxide film. Thereafter, with the mask material used as a stopper, the silicon oxide film is planarized by a chemical mechanical polishing (CMP) method to provide the buried insulating film 104. Then the second floating gate 103b is formed on the first floating gate 103a.

In the case where the floating gate is initially formed as set out above, the floating gate 103 is comprised of the first floating gate 103a and second floating gate 103b and hence is made thicker. As shown in FIG. 8, therefore, when the floating gate 103 is etched back to the gate oxide film 102 with the mask material 107 and control gate 106 as a mask, the aspect ratio becomes greater. It is, therefore, difficult to set a selection ratio between the polysilicon as the floating gate 103 and the gate oxide film optimal. In the case where, for example, the selection ratio is set greater, the polysilicon is less likely to be etched. This provides a possibility of the polysilicon remaining. In the case where, on the other hand, the selection ratio is set smaller, etching is not stopped to the gate oxide film 102 and reaches the semiconductor substrate 101, thus presenting a problem.

BRIEF SUMMARY OF THE INVENTION

The present invention solves the above-mentioned task and the object of the present invention is to provide a nonvolatile semiconductor memory device and method for manufacturing the same which, when a floating gate is etched, ensures easier etching control.

The object of the present invention is achieved by the following device.

A nonvolatile semiconductor memory device comprises a floating gate formed over a semiconductor substrate with a gate insulating film formed therebetween, a control gate insulated from the floating gate and source/drain regions formed in the semiconductor substrate at those areas situated on both sides of the floating gate and an insulating film provided inside the floating gate.

Further, the object of the present invention is achieved by the following device.

A nonvolatile semiconductor memory device comprises a first conductive film formed over a semiconductor substrate with a gate insulating film formed therebetween, a first insulating film formed on the first conductive film, a second conductive film formed on the first insulating film, the second conductive film and first conducive film constituting a floating gate, a second insulating film formed on the second conductive film, a third conductive film formed on the second insulating film and constituting a control gate, and source/drain regions formed in the semiconductor substrate at those areas situated on both sides of the floating gate.

Further, the object of the present invention is achieved by the following method.

A method for manufacturing a nonvolatile semiconductor memory device comprises the steps of forming a first polysilicon film over a semiconductor substrate with a gate insulting film formed therebetween, forming a first insulating film on the first polysilicon film, forming a second polysilicon film on the first insulating film, forming a second insulating film on the second polysilicon film, forming a third polysilicon film on the second insulating film, forming a mask material on the third polysilicon film, a first etching process for etching the third polysilicon film by using mask material as a mask, the first etching process forming a control gate, a second etching process for etching the second polysilicon film to the first insulating film by using mask material as a mask, the second etching process forming a first floating gate, and a third etching process for etching the first polysilicon film to the gate insulating film by using mask material as a mask, the third etching process forming a second floating gate.

According to the present invention, the gate insulating film is provided inside the floating gate and, by using this insulating film as an etching stopper, the etching control can be easily effected when the polysilicon constituting the floating gate is etched.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the present invention will be explained below with reference to the accompanying drawing.

Figure 1:
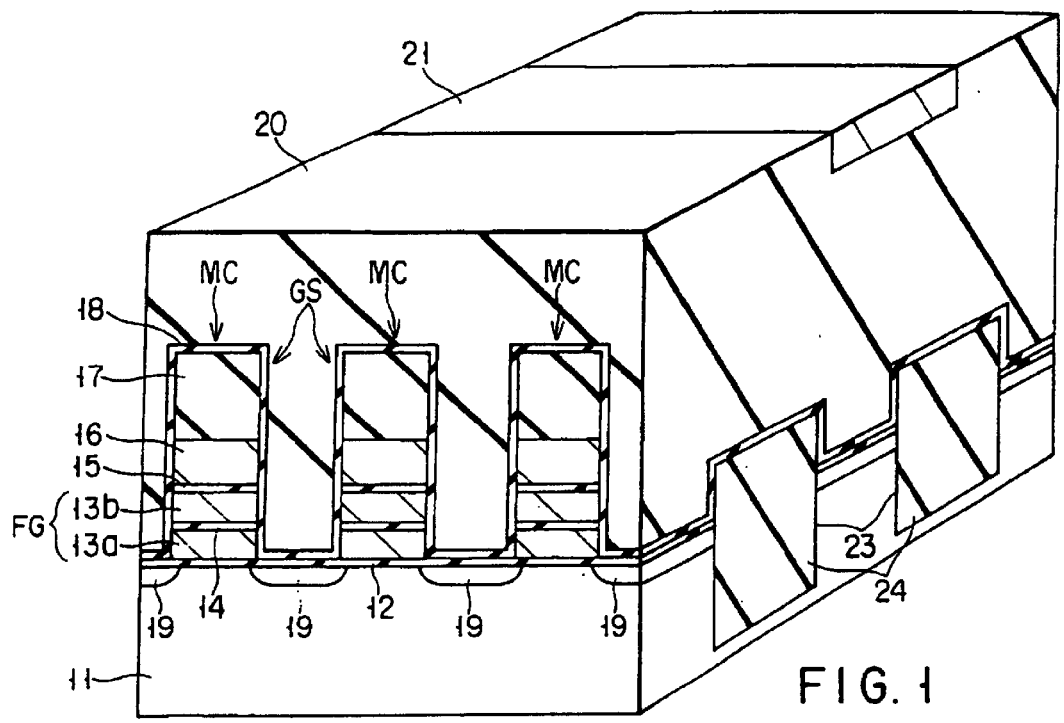
FIG. 1 shows a perspective view showing an embodiment of the present invention.

FIG. 1 shows a nonvolatile semiconductor memory device of the present invention and shows the case where the present invention is applied to a NAND type flash EEPROM for initially forming a gate. In FIG. 1, one NAND cell comprises a plurality of memory cells MC connected in a series array. Each NAND cell is separated by an STI area comprised of a buried insulating film 24 formed in a semiconductor substrate 11 of, for example, a P type.

In the respective memory cell MC, a gate oxide film 12 is formed on a surface of the semiconductor substrate 11. A first floating gate 13a of, for example, polysilicon is formed on the gate oxide film 12 to provide a floating gate FG. An insulating film 14 constituting the feature of the present invention is formed on a first floating gate 13a. This insulating film 14 is comprised of, for example, a silicon oxide film. A second floating gate 13b of, for example, polysilicon is formed on the insulating film 14 to provide a floating gate FG. And an ONO film 15 for example is formed as a composite insulating film on the second floating gate 13b and a control gate 16 of, for example, polysilicon is formed on the film 15 and a mask material 17 of, for example, a silicon nitride film is formed on the control gate 16. The mask material 17, control gate 16 and first and second floating gates 13a and 13b are covered with the silicon nitride film 18 to provide a gate structure GS.

n-Type diffusion layers 19 are formed as source and drain regions in the semiconductor substrate 11 at those areas situated between the gate structures GS. One memory cell MC is formed by the diffusion layers 19 and gate structure GS. The respective memory cells MC are series-connected with the diffusion layers 19 shared by those adjacent ones. These memory cells MC are covered with an interlayer insulating film 20 of, for example, BPSG and an interconnect line 21 of, for example, tungsten is formed at the inter interlayer insulating film 20.

FIGS. 2 to 6 show the process for manufacturing a nonvolatile semiconductor memory device shown in FIG. 1 and the same reference numerals are employed to designate parts or elements corresponding to those shown in FIG. 1.

Figure 2A:
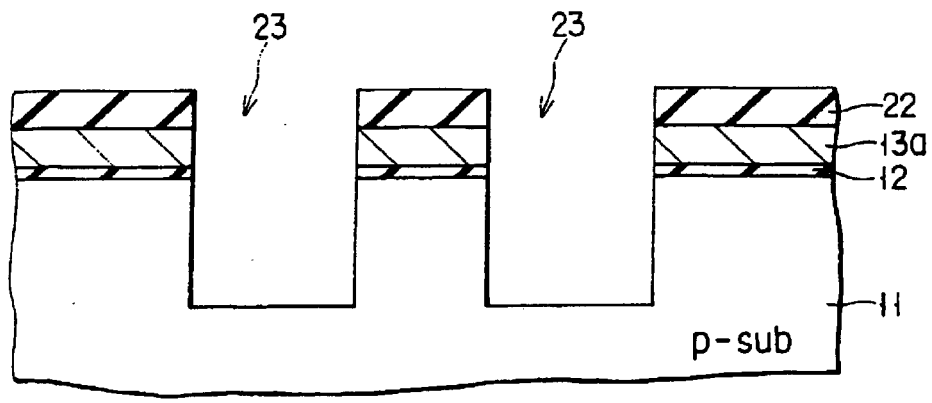
FIGS. 2A to 2C are cross-sectional views sequentially showing the manufacturing steps of the embodiment in FIG. 1.

First, as shown in FIG. 2A, a gate oxide film 12, first floating gate 13a of, for example, polysilicon and mask material 22 of, for example, silicon nitride film are sequentially formed over the surface of a semiconductor substrate 11. Then, the mask material 22 is subjected to a patterning process. With the patterned mask material 22 used as a mask, the first floating gate 13a, gate oxide film 12 and semiconductor substrate 11 are etched by, for example, an RIE etching method to provide a plurality of trenches 23.

Figure 2B:
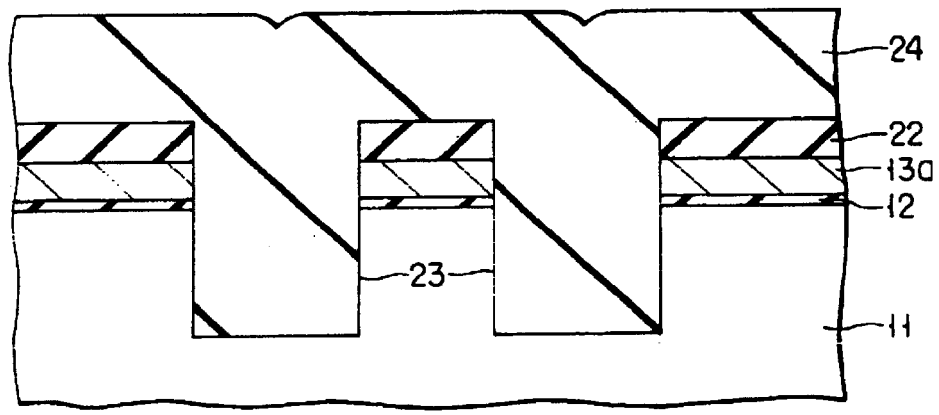

Then, as shown in FIG. 2B, a buried insulating film 24 of, for example, a silicon oxide film is deposited on a whole surface by, for example, a CVD (chemical vapor deposition) method and the trench 23 is buried with the insulating film 24. As the buried insulating film 24 use can be made of, for example, TEOS (tetra-ethylortho-silicate) film, HDP (high density plasma decomposition) film, etc. Thereafter, with the mask material 2 used as a stopper, the silicon oxide film 24 is planarized by a CMP (chemical mechanical polishing) method.

Figure 2C:
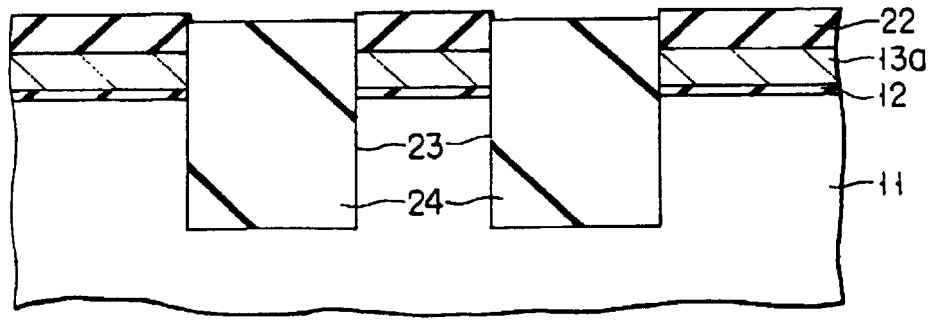

Then, as shown in FIG. 2C, by dry or wet etching the surface of the silicon oxide film 24 in the trench 23 is made somewhat lower than the surface of the mask material 22. By doing so, a step difference between the surface of the first floating gate 13a and the surface of the buried insulating film 24 is decreased and the mask material 22 is eliminated.

Figure 3A:
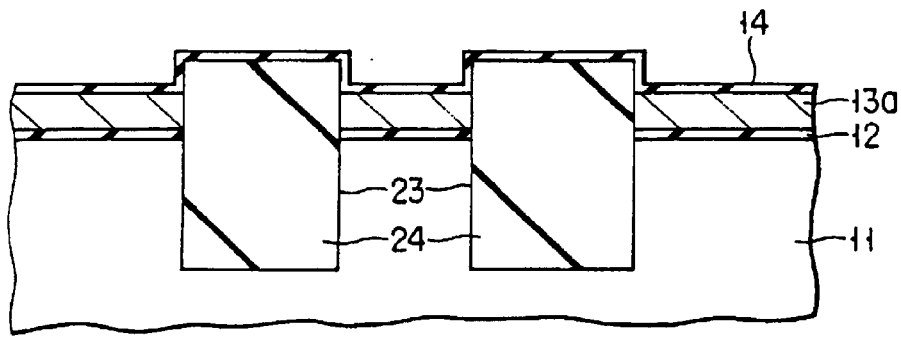
FIGS. 3A to 3C are cross-sectional views sequentially showing the manufacturing steps following the manufacturing step of FIG. 2C.

Then, as shown in FIG. 3A, an insulating film 14 is formed on the surface of the first floating gate 13a. This insulating film 14 is formed in an oxidation atmosphere, for example, by exposing the substrate structure to an oxidation-filled atmosphere in a furnace or can be formed by depositing a silicon oxide film or silicon nitride film on the first floating gate 13a with the use of, for example, an LPCVD (low pressure CVD).

It is necessary that the insulating film 14 be made to have some thickness to allow it to act as a stopper in an etching process to be done on a second floating gate as will be described later. In order to suppress a lowering in a coupling ratio of the floating gate, the thickness of the insulating film 14 is preferably made as small as possible. Therefore, the thickness of the insulating film 14 is set in a range of, for example, above about 10 angstrom but below about 50 angstrom and the optimal value is, for example, about 25 to 35 angstrom. The film thickness is substantially the same as in the case of a silicon oxide film or silicon nitride film.

Figure 3B:
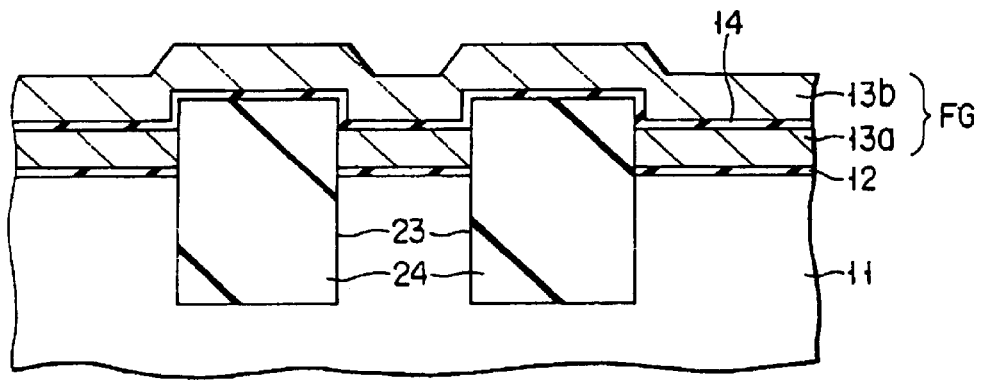

Then, as shown in FIG. 3B, a second floating gate 13b of, for example, polysilicon is formed on a whole surface of the insulating film 14.

Figure 3C:
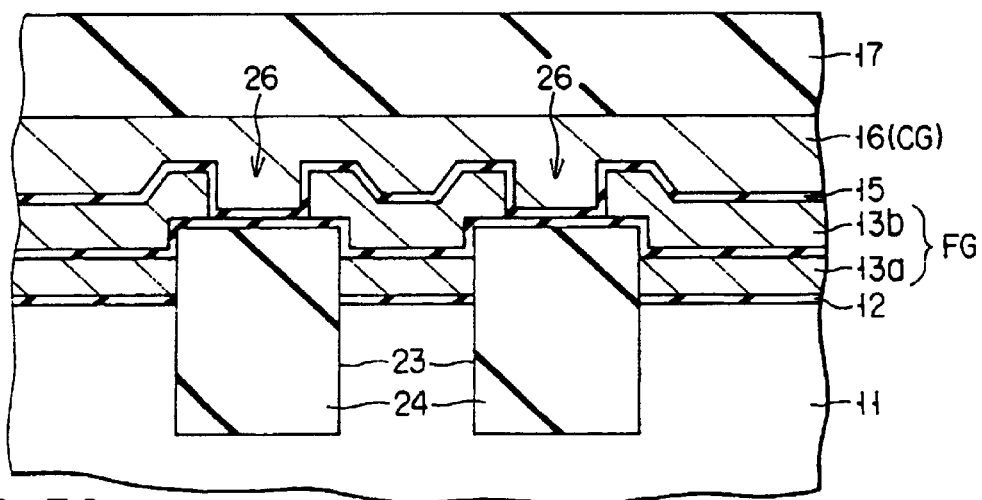

Then, as shown in FIG. 3C, the second floating gate 13b is patterned by the dry etching to form a slit 26 over the upper surface of the buried insulating film 24. Then, for example, an ONO film 15 as a composite insulating film, control gate (CG) 16 of, for example, polysilicon and mask material of, for example, a silicon nitride film are sequentially formed on a whole surface including the second floating gate 13b.

Figure 4:
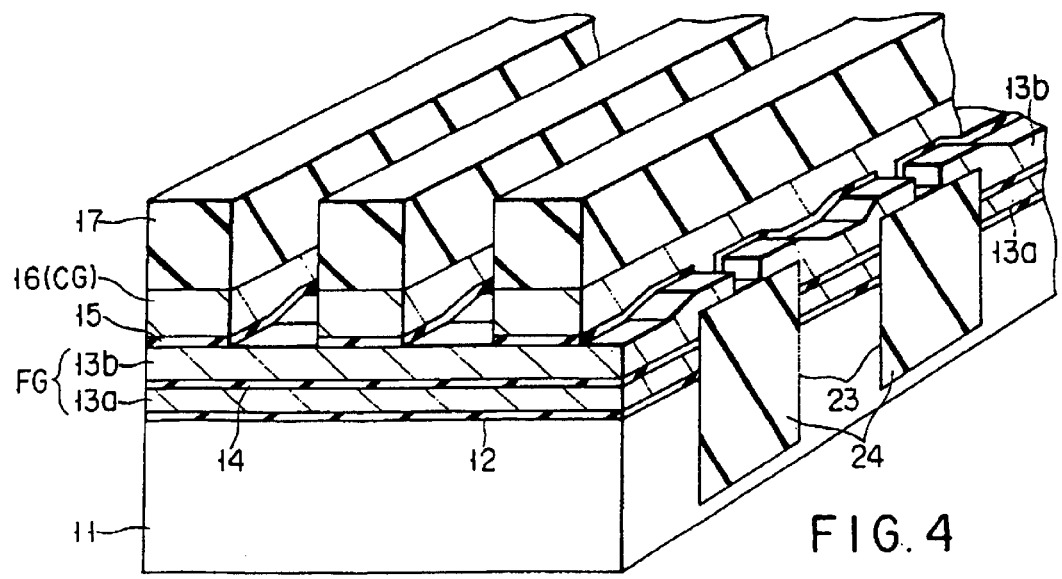
FIG. 4 is a perspective view showing the manufacturing step following the manufacturing step of FIG. 3C.

Then, as shown in FIG. 4, the mask material 17 is patterned by, for example, the dry etching. With the use of the patterned mask material 17, the polysilicon of the control gate 16 and ONO film 15 are etched by, for example, the RIE etching.

Figure 5:
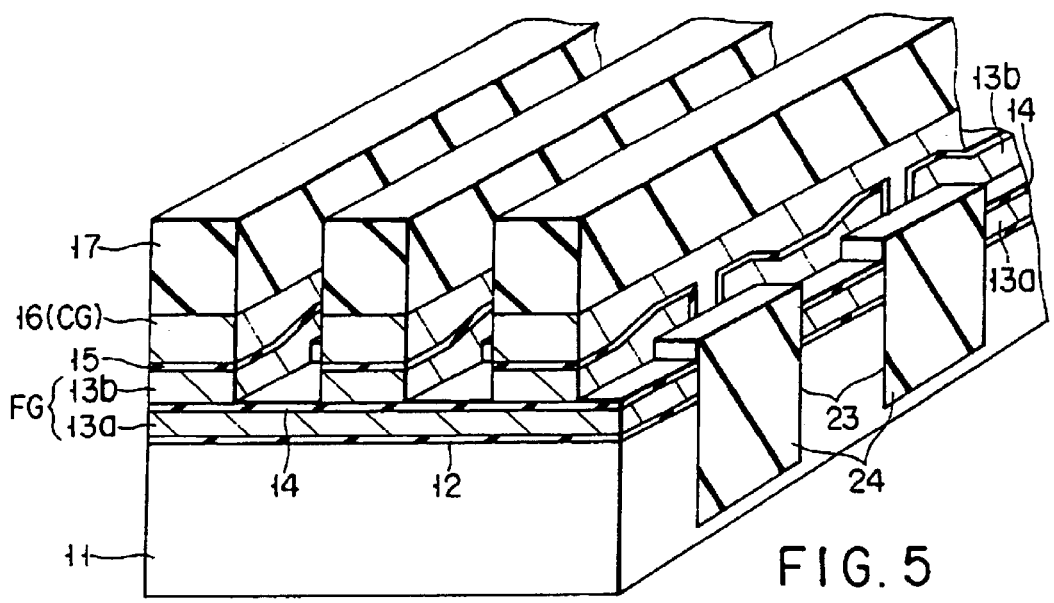
FIG. 5 is a perspective view showing the manufacturing step following the manufacturing step of FIG. 4.

Then, as shown in FIG. 5, the polysilicon constituting the second floating gate 13b is etched by, for example, the RIE etching method under a condition of a greater selection ratio to the insulting film 14. For this reason, it is possible to prevent the polysilicon remaining between those second floating gates 13b. Thereafter, the insulating film 14 is removed by the dry or wet etching.

Figure 6:
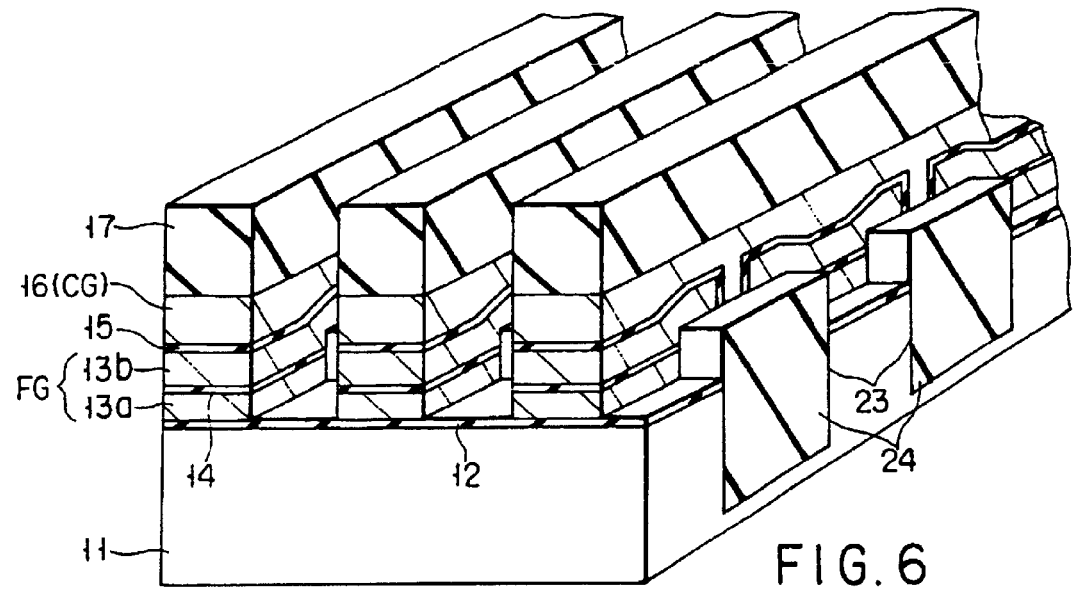
FIG. 6 is a perspective view showing the manufacturing step following the manufacturing step of FIG. 5.
Figure 7:
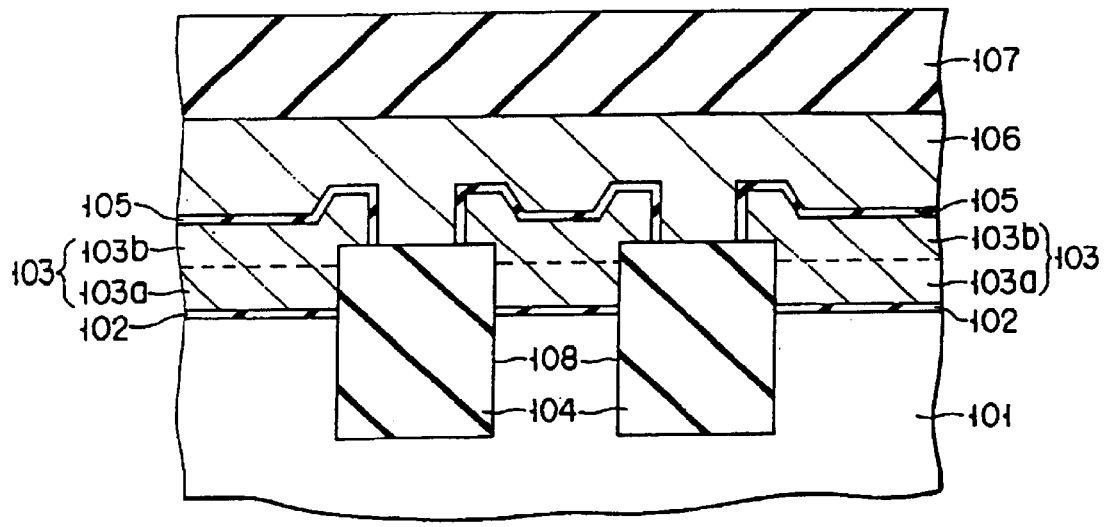
FIG. 7 is a cross-sectional view showing a conventional nonvolatile semiconductor memory device.
Figure 8:
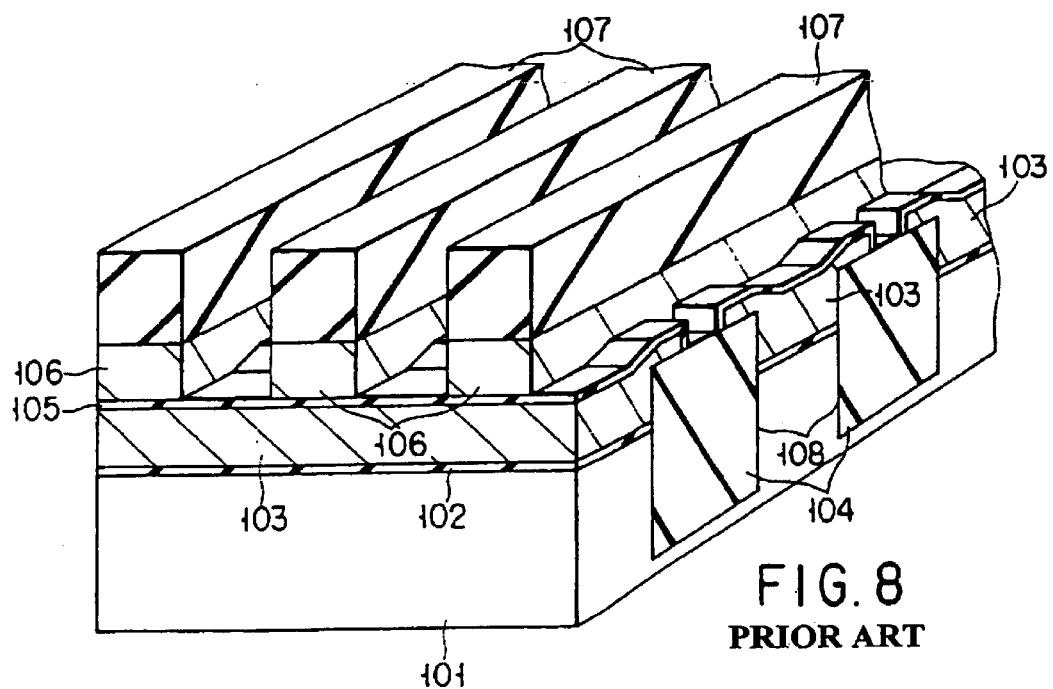
FIG. 8 is a perspective view showing the manufacturing step following the manufacturing step of FIG. 7.

Then, as shown in FIG. 6, the polysilicon constituting the first floating gate 13a is etched by, for example, the RIE etching method under a condition of a greater selection ratio to the gate oxide film 12. For this reason, it is possible to prevent the polysilicon remaining between the first floating gates 13a. Further, the etching processing is stopped with the gate insulation film 12 and, therefore, the substrate 11 can be prevented from being etched.

Thereafter, as shown in FIG. 1, the mask material 17, control gate 16 and first and second floating gates 13a and 13b are covered with a silicon nitride film 18 and a gate structure GS is formed and n-type diffusion layers 19 acting as source and drain regions are formed in the semiconductor substrate 11 at those areas situated between the respective gate structures GS. The diffusion layers 19 and gate structure GS provide one memory cell MC. Those memory cells MC is covered with an interlayer insulating film 20 of, for example, BPSG. An interconnect line 21 of, for example, tungsten and contact holes, not shown, are formed at the interlayer insulating film 20 to provide a NAND type flash EPROM.

According to the above-mentioned embodiment, the insulating film 14 is formed on the first floating gate 13a and the second floating gate 13b is formed on the insulating film 14, and the second and first floating gates 13b and 13a are etched by two separate steps. Therefore, the aspect ratio at the respective etching processing can be made smaller than in the conventional method and the etching control, that is, the setting of the etching condition, becomes easier. When, therefore, the polysilicon constituting the second floating gate 13b is etched, it is done under a condition of a greater selection ratio to the insulating film 14 and it is possible to prevent the polysilicon remaining between those second floating gates 13b. Further, when the polysilicon constituting the first floating gate 13a is etched, it is done under a condition of a greater selection ratio to the gate oxide film 12. For this reason, it is possible to prevent the polysilicon remaining between those first floating gates 13a and the etching processing can be stopped down to the gate oxide film 12, so that the etching of the substrate 11 can be prevented.

As set out above, by providing the insulating film 14 between the first and second floating gates 13a and 13b, the coupling ratio is lowered, thus presenting a problem. A voltage Vfg on the floating gate FG is represented by the following equation:

$$Vfg=(Cono/(Cono+Cox)+Cox \times Cono/Cf)Vcg$$

where
Cono: a capacitance of the ONO film 15
Cox: a capacitance of the gate oxide film 12
Cf: a capacitance of the insulating film 14
Vcg: a voltage on the control gate 16.

As evident from the above, if the capacitance cf of the insulating film 14 is set to be greater, then it is possible to decrease an adverse effect resulting from the insulating film 14. For this reason, it is possible to suppress a lowering in coupling ratio by making the thickness of the insulating film 14 smaller or making the permittivity greater. A practical example of the film thickness of the insulating film 14 is as set out above.

Although, the above-mentioned embodiment has been explained as being applied to the NAND cell type EEPROM, the present invention is not restricted thereto and can also be applied to a NOR type EEPROM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a nonvolatile semiconductor memory device comprising:

forming a first polysilicon film over a semiconductor substrate with a gate insulating film formed therebetween;

forming a first insulating film on the first polysilicon film;

forming a second polysilicon film on the first insulating film;

forming a second insulating film on the second polysilicon film;

forming a third polysilicon film on the second insulating film;

forming a mask material on the third polysilicon film;

a first etching process which etches the third polysilicon film and the second insulating film by using the mask material as a mask, the first etching process forming a control gate;

a second etching process which etches the second polysilicon film to the first insulating film by using the mask material as a mask under a condition where a greater selection ratio to the first insulating film is satisfied the second etching process forming a first floating gate; and a third etching process which etches the first polysilicon film by using the mask material as a mask under a condition where a greater selection ratio to the sate insulating film is satisfied, the third etching process forming a second floating gate.

2. The method according to claim 1, wherein the first insulating film is formed by one of oxidizing the first polysilicon and depositing an insulating material.

3. The method according to claim 1, wherein the first insulating film is comprised of one of a silicon oxide film and a silicon nitride film.

4. The method according to claim 3, wherein the thickness of the first insulating film is in a range of above about 10 angstroms but below about 50 angstroms.

5. A method for manufacturing a nonvolatile semiconductor memory device, comprising:

sequentially forming a gate insulating film, first polysilicon film and first insulating film over a semiconductor substrate;

forming a trench in the semiconductor substrate through the gate insulating film, first polysilicon film and first insulating film;

depositing a second insulating film over a whole surface to bury the trench with the second insulating film;

removing the second insulating film by etching to allow the second insulating film to remain in the trench at a height level lower than the surface of the first insulating film;

removing the first insulating film;

forming a third insulating film on the first polysilicon film;

forming a second polysilicon film on the third insulating film;

forming a fourth insulating film on the second polysilicon film;

forming a third polysilicon film on the fourth insulating film;

forming a mask material on the third polysilicon film;

a first etching process which etches the third polysilicon film and the fourth insulating film by using the mask material as a mask, the first etching process forming a control gate;

a second etching process which etches the second polysilicon film to the third insulating film by using the mask material as a mask, the second etching process forming a first floating gate; and a third etching process which etches the first polysilicon film by using the mask material as a mask, the third etching process forming a second floating gate.

6. The method according to claim 5, wherein the third insulating film is formed by one of oxidizing the first polysilicon film and depositing an insulating material.

7. The method according to claim 5, wherein the second etching process has a greater selection ratio to the third insulating film.

8. The method according to claim 7, wherein the third insulating film is comprised of one of a silicon oxide film and a silicon nitride film.

9. The method according to claim 8, wherein the thickness of the third insulating film is in a range of above about 10 angstroms but below about 50 angstroms.

* * * * *